(12) United States Patent  (10) Patent No.: US 8,289,041 B2
Yamane et al.  (45) Date of Patent: Oct. 16, 2012

(54) SEMICONDUCTOR INTEGRATED CIRCUIT DEVICE WHICH HAS FIRST CHIP AND SECOND CHIP ACCESSED VIA THE FIRST CHIP AND TEST METHOD THEREOF

(75) Inventors: Kazunori Yamane, Kanagawa (JP); Takayuki Kurokawa, Kanagawa (JP); Yuji Tada, Kanagawa (JP); Hironori Nakamura, Kanagawa (JP); Manabu Kitabatake, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 777 days.

(21) Appl. No.: 12/314,689

(22) Filed: Dec. 15, 2008

(65) Prior Publication Data

US 2009/0167337 A1 Jul. 2, 2009

(30) Foreign Application Priority Data

Dec. 27, 2007 (JP) ................................ 2007-336421

(51) Int. Cl.
G01R 31/3187 (2006.01)
(52) U.S. Cl. ..................... 324/750.3; 438/17; 714/733
(58) Field of Classification Search ............... 324/750.3, 324/762.02, 73.1, 762.01, 537; 714/733–734, 714/718, 724; 365/201; 438/14–18
See application file for complete search history.

(56) References Cited

U.S. PATENT DOCUMENTS

| 5,084,838 | A * | 1/1992 | Kajimoto et al. ............... 365/63 |
| 7,541,680 | B2 * | 6/2009 | Kwon et al. .................. 257/777 |
| 7,577,885 | B2 * | 8/2009 | Hasegawa et al. ............ 714/718 |
| 7,617,425 | B2 * | 11/2009 | Nadeau-Dostie et al. ..... 714/719 |
| 2003/0065997 | A1 * | 4/2003 | Yamazaki et al. ............ 714/718 |
| 2005/0230796 | A1 * | 10/2005 | Sakamoto et al. ............ 257/678 |
| 2007/0079052 | A1 | 4/2007 | Hasegawa et al. |
| 2007/0245200 | A1 | 10/2007 | Hattori et al. |
| 2009/0015286 | A1 * | 1/2009 | Kitabatake et al. ........... 324/763 |

FOREIGN PATENT DOCUMENTS

| CN | 101042939 (A) | 9/2007 |
| JP | 5-232188 | 9/1993 |
| JP | 6-69308 | 3/1994 |

OTHER PUBLICATIONS

Chinese Office Action dated May 30, 2012, with English-language translation.

* cited by examiner

*Primary Examiner* — Arleen M Vazquez
(74) *Attorney, Agent, or Firm* — McGinn IP Law Group, PLLC

(57) ABSTRACT

A semiconductor integrated circuit device includes a first chip including an internal circuit, and a second chip capable of being accessed only via the first chip, and a test processor circuit electrically connected internally via the first chip, for accessing the second chip from an external terminal and testing the second chip, and a test circuit where an input/output buffer is installed for signals for accessing the second chip within the test processor circuit, and a bypass line installed for transferring signals from the first chip to the second chip and avoiding the input/output buffer within the test processor circuit, and a switch which switches between signal transfer path via the input/output buffer, and a signal transfer path via the bypass line.

13 Claims, 11 Drawing Sheets

PRIOR ART

PRIOR ART

SEMICONDUCTOR INTEGRATED CIRCUIT DEVICE WHICH HAS FIRST CHIP AND SECOND CHIP ACCESSED VIA THE FIRST CHIP AND TEST METHOD THEREOF

BACKGROUND OF THE INVENTION

1. Field of the Invention

This invention relates to a semiconductor integrated circuit device where multiple chips are mounted in the same package and a test method for that semiconductor integrated circuit device.

This application has foreign priority benefits of Japanese Patent Application No. 2007-336421 having a Japanese filing date of Dec. 27, 2007.

2. Description of Related Art

Semiconductor integrated circuit devices for large scale systems are being planned that utilize the SiP (System in Package) structure where a mixture of chips with multiple different functions such as memory chips and logic chips are mounted in one package. In semiconductor integrated circuit devices using the SiP structure however there is a limit on the number of input/output terminals that can be installed on the package due to ever smaller package sizes and demands to reduce the number of pins. So on an increasing number of packages there are no input/output terminals for external direct access to the memory chip. However making memory tests after assembling the package is impossible unless there is an external output from the memory terminals. One way to avoid this problem is a method that tests the memory chip via the logic chip.

FIG. 10 is a block diagram showing a semiconductor integrated circuit device with SiP structure of a related art for testing the memory chip by way of the logic chip (patent document 1). This semiconductor integrated circuit device of the background art contains a logic chip 502 and a memory chip 503 on an organic substrate (interposer).

The logic chip 502 internally contains a test processor circuit 505 and an internal circuit 504. This memory chip 503 is structured to input and output data in reply to the access requests made via the logic chip 502, and does not directly connect to the external terminals on the SiP (package) 501.

As shown in FIG. 10, the test processor circuit 505 contains a test circuit 521, and a high-speed test control circuit 522. The high-speed control circuit 522 on SiP 501 connects to the access terminals on the memory chip 503 by way of the test circuit 521, controls the read and write operation on the memory chip 503 from the external terminals 523n, and also tests the memory chip 503 by monitoring the read data. This high-speed test control circuit 522 is capable of selecting the signal transfer rate between the external terminal 523n and the memory chip 503 according to the data speed.

FIG. 11 shows a portion of the block diagram of test processor circuit 505. The high-speed test control circuit 522 connects to the external terminal 523n as was already described. The signal A is then input by way of the external terminal 523n. This signal A is input by way of a buffer 531 to one of the input terminals of the AND gate 542.

The output signal from this AND gate 542 connects directly to one of the input terminals on the selector 551, and the output from a high-speed test adjuster circuit 547 is input to the other input terminal. During low-speed test mode, the selector 551 selects the output signal from the AND gate 542; and during high-speed test mode selects the output signal from the high-speed test adjuster circuit 547.

Moreover, the selector 551 supplies an output signal to one of the input terminals on the selector 554, and the internal circuit 504 inputs a signal to the other input terminal on the selector 554. During test mode, the selector 551 output signal is selected, and during the actual operation mode the signal from the internal circuit 504 is selected and output. The output signal from this selector 554 is output by way of a buffer 560 as the signal B, to the memory chip 503.

The memory chip 503 supplies the signal B by way of the buffer 559 to one input terminal of the AND gate 550, and this signal B connects to the internal circuit 504. The output signal from the AND gate 550 is supplied to one of the input terminals on the selector 539, and the output signal from a high-speed test adjuster circuit 546 is supplied to the other input terminal. During low-speed test mode the selector 539 selects the output signal from the AND gate 550; and during high-speed test mode selects the output signal from the high-speed test adjuster circuit 546.

Moreover, the selector 539 output signal is supplied to one of the input terminals on the selector 537; and a user mode signal from the internal circuit 504 is supplied to the other input terminal. During test mode the output from the selector 539 is selected; and during actual operation mode the user mode signal from the internal circuit 504 is selected and output. The output from the selector 537 is output via the buffer 530 from the test terminal $523_1$.

The high-speed test adjuster circuit contains multiple retiming flip-flops. These flip-flops can suppress variations in the delay time that were caused by fluctuations in device characteristics. High speed signals can in this way propagate across long distances.

Patent documents 2 and 3 described in the problem to be solved by the Invention disclose semiconductor integrated circuit devices for directly monitoring the analog level.

[Patent document 1] Japanese Patent Application Laid Open No. 2007-255984, FIG. 1 through 3, Paragraphs 0022-0038

[Patent document 2] Japanese Patent Application Laid Open No. Hei5 (1993)-232188

[Patent document 3] Japanese Patent Application Laid Open No. Hei6 (1994)-69308

SUMMARY

Function tests can be made on memory chips in semiconductor integrated circuit devices of the background art by attaching test selector multiplexors and logic input/output drivers on the path from the test devices (hereafter called "tester") connected outside the package to the memory chip. In other words, the memory inputs/outputs could be controlled and monitored by testing their H (High)/L (Low) logic.

However these semiconductor integrated circuit devices could not perform the analog tests as implemented in patent documents 2 and 3. Analog tests can check for problems such as leaks prior to shipping the product. The analog testing also performs tests that are important in terms of guaranteeing the device against performance defects.

The semiconductor integrated circuit device of this invention contains: a first chip including an internal circuit; and a second chip capable of being accessed only via the first chip; and a test processor circuit electrically connected to the internal circuit in the first chip, for accessing the second chip from the external terminal and testing the second chip; and a test circuit where an input/output buffer is installed for signals for accessing the second chip within the test processor circuit; and a bypass line installed for transferring signals from the first chip to the second chip while bypassing the input/output buffer within the test processor circuit; and a switching means for switching between a signal transfer path via an input/output buffer, and a signal transfer path via the bypass line.

The semiconductor integrated circuit device of this invention contains bypass lines and so can perform analog testing of the memory chip as well as make function tests on the second chip in semiconductor integrated circuit devices with SiP structures where the second chip only connects to the first chip. A high reliability semiconductor integrated circuit device can therefore be provided that detects defective products with high accuracy.

The test method for semiconductor integrated circuit devices of the first exemplary embodiment of this invention performs analog tests on input/output terminals of the second chip of the above semiconductor integrated circuit device by way of the bypass line from the external terminals. A method for testing the high reliability semiconductor integrated circuit device can therefore be provided by performing analog testing in addition to making function tests on the second chip.

In the test method for semiconductor integrated circuit devices of the second exemplary embodiment of this invention, signals are input from the external terminal, and made to take a signal transfer path via the input/output buffer, as well as a signal transfer path via the bypass line; and an output signal is detected on the analog level from an external terminal different from the external terminal where the signals were input. A method for testing the high reliability semiconductor integrated circuit device can therefore be provided by performing testing on the analog level in addition to making function tests on the second chip.

This invention therefore renders a superior effect by providing a high reliability semiconductor integrated circuit device and test method for that device.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
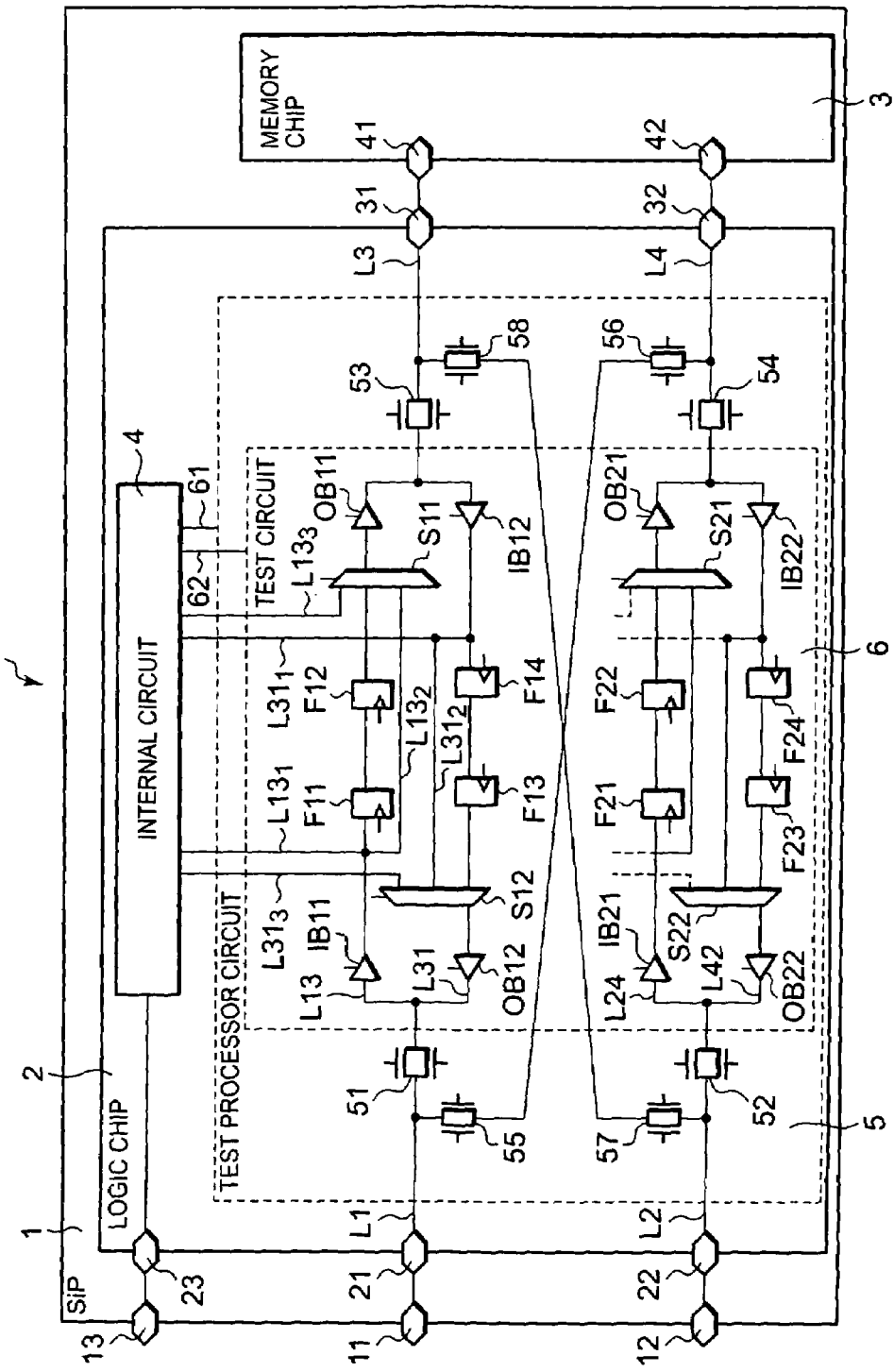
FIG. 1 is a structural block diagram of the semiconductor integrated circuit device of a first exemplary embodiment.

FIG. 1 is a block diagram showing a semiconductor integrated circuit device with SiP structure of an exemplary embodiment. As shown in this figure, the semiconductor integrated circuit device 101 includes a logic chip 2 serving as the first chip and containing designated functions such as signal processing, and a memory chip 3 serving as the second chip for the SDRAM (Synchronous Dynamic Random Access Memory), and both (the logic chip 2 and the memory chip 3) are mounted in the same package 1. The package 1 is connectable to a tester (not shown in drawing) which is an external device installed outside the package.

The logic chip 2 carries out access to the memory chip 3. The memory chip 3 is in other words structured to input and output data in response to access requests from the logic chip and without a direct connection to external terminals on the package 1. In the example described in FIG. 1 there were two pairs of access terminals on the memory chip 3 and the logic chip 2. However, that method is only for purposes of convenience and more than two pairs of access terminals may be utilized for actual use.

Multiple memory arrays not shown in the drawing are mounted within the memory chip 3. Various types of memory input/output terminals (hereafter, called "memory terminal") 41, 42 are mounted on the periphery of the memory array. The memory terminal 40 for example is a terminal for inputting and outputting data signals and address signals in the memory.

The memory terminals 41, 42 each connect to a memory connection logic terminals (hereafter called, "memory connection terminal") 31, 32 matching each logic chip (See FIG. 1). The memory connection terminal 31 connects by way of a wire or bump to the memory terminal 41. The memory connection terminal 32 likewise connects by way of a wire or bump to the memory terminal 42.

As shown in FIG. 1, the internal circuit 4, the test processor circuit 5, and multiple input/output terminals such as the memory connection terminals 31, 32 are mounted on the logic chip 2. The internal circuit 4 is a circuit for implementing the essential functions of the logic chip 2, and is electrically connected with the test processor circuit 5 inside the logic chip 2. The test circuit 6 is mounted inside the test processor circuit 5.

Besides the signal transfer path via the test processor circuit 5, the internal circuit 4 is structured to connect directly to the external terminal 13 installed on the package 1 without passing through the test processor circuit 5. A logic control terminal 23 installed on the logic chip 2 connects the internal circuit 4 with the external terminal 13 on the package 1. A test processor control line 61 is installed between the internal circuit 4 and the test processor circuit 5. The processor circuit control signal propagates from the internal circuit 4 to the test processor circuit 5 by way of the applicable line. A test circuit control line 62 is installed between the internal circuit 4 and the test circuit 6 installed within the test processor circuit 5. The test circuit control signal propagates from the internal circuit 4 to the test circuit 6 by way of the applicable line. In the example described using FIG. 1, one each of the logic control terminal 23, the test processor control circuit line 61, and the test control circuit line 62 were installed but that was for purposes of simplifying the description and any required number may be used for actual operation.

The test circuit 6 is installed as already described in the test processor circuit 5. This test circuit 6 has the role of making functions tests on the memory chip 3. This test circuit 6 contains multiple input buffers functioning as input drivers, and an output buffer functioning as an output driver, the selector circuit (hereafter, called "selector") serving as a test selector multiplexer and a flip-flop circuit (hereafter, called "flip-flop"), etc. This test circuit 6 is also usable during the memory operation test output.

The memory connection terminals 31, 32 connect by way of the test processor circuit 5 with the respective matching external connection logic terminals (hereafter called "external connection terminals") 21, 22 within the logic chip 2. The external connection terminals 21, 22 connect to the respective corresponding external terminals 11, 12 of package 1. The external terminals 11, 12 connect for example to the internal test terminals of a tester (not shown in drawing) during operation check-tests within the memory chip 3. Restated in other words, the external tester (not shown in drawing) is structured to connect with the memory chip 3 by way of the test processor circuit 5 within the logic chip 2.

The operation for accessing the memory chip 3 from the logic chip 2 is as follows. Namely, during actual operation, the logic chip 2 supplies a memory access signal from the internal circuit 4 to the memory chip 3 to access the memory chip 3. The internal circuit 4 performs the specified operation according to the signal that was input and outputs the signal to the test circuit 6 within the test processor circuit 5. Data input from the various data signals is loaded into the memory chip 3 and data writing is performed. When the logic chip 2 sends a data loading command, the data is loaded from the address specified by the memory chip 3 and the loaded (read out) data is sent to the logic chip 2.

During testing to check the memory chip 3 operation, the test signals are supplied by way of the test processor circuit 5 to the memory chip 3, and the logic chip 2 performs tests to check the operation on the memory chip 3. The tester (not shown in drawing) sends waveforms such as for data signals and control command signals by way of the external terminals 11, 12 installed on the package 1, to the test processor circuit 5 within the logic chip 2.

The internal structure within the logic chip 2 is next described in detail. The logic chip 2 contains a first line L1—fourth line L4 and the connected terminals that are mounted in the logic chip 2. The first line L1 extends from the external connection terminal 21 mounted in the logic chip 2, to the test circuit 6 within the test processor circuit 5. The second line L2 in the same way extends from the external connection terminal 22 to the test circuit 6. The third line L3 extends from the memory connection terminal 31 to the test circuit 6. The fourth line L4 extends from the memory connection terminal 32 to the test circuit 6.

The first line L1 and the third line L3 connect via the output branch line L31 and input branch line L13 formed within the test circuit 6. The second line L2 and the fourth line L4 in the same way connect by way of the output branch line L42 and the input branch line L24 installed within the test circuit 6 (See FIG. 1).

Moreover, the first line L1 and the fourth line L4 are connected by the bias line BL14 within the test processor circuit 5. The second line L2 and the third line L3 connect in the same way by way of the bypass line BL23 with the test processor circuit 5. The two bypass lines BL14, BL23 are installed within the test circuit 6 so as to bypass the input/output buffer functioning as the circuit for changing the signal amplitude.

The first input buffer IB11, the first flip-flop F11, the second flip-flop F12, the first selector S11, and the first output buffer OB11 are formed serially in that order from the side near the first wire L1, within the input branch line L13 in the test circuit 6. The first input buffer IB21, the first flip-flop F21, the second flip-flop F22, the first selector S21, and the first output buffer OB21 are formed serially in the same way in that order from the side near the second line L2, on the input branch line L23.

The second input buffer IB12, the fourth flip-flop F14, the third flip-flop F13, the second selector S12, and the second output buffer OB12 are formed serially in that order from the side near the third line L3, in the output branch line L31 formed within the test circuit 6. The second input buffer IB22, the fourth flip-flop F24, the third flip-flop F23, the second selector S22, and the second output buffer OB22 are formed serially in the same way in that order from the side near the fourth line L4, on the output branch line L42.

Eight transfer circuits are formed as the first transfer circuit 51 through the eighth transfer circuit 58 within the test processor circuit 5. The first transfer circuit 51 is at a position past the branch point of the bypass line BL14 branching from the first line L1, and installed before the test circuit 6. The second transfer circuit 52 is in the same way, at a position past the branch point of the bypass line BL23 branching from the second line L2, and installed before the test circuit 6.

The third transfer circuit 53 is at a position past the branch point of the bypass line BL23 branching from the third line L3, and installed before the test circuit 6. The fourth transfer circuit 54 is in the same way, at a position past the branch point of the bypass line BL14 branching from the fourth line L4, and installed before the test circuit 6.

The fifth transfer circuit 55 is on the bypass line BL14, and formed at a position directly after branching from the first line L1. The sixth transfer circuit 56 is on the bypass line BL14, and formed at a position directly after branching from the fourth line L4. The seventh transfer circuit 57 is in the same way at a position on the bypass line BL23, and formed at a position directly after branching from the second line L2. The eighth transfer circuit 58 is on the bypass line BL23, and formed at a position directly after branching from the third line L3. In the example described for the first exemplary embodiment, two transfer circuits were formed respectively on the bypass lines BL14, BL23, however a single transfer circuit may be provided on each transfer line.

Figure 2:
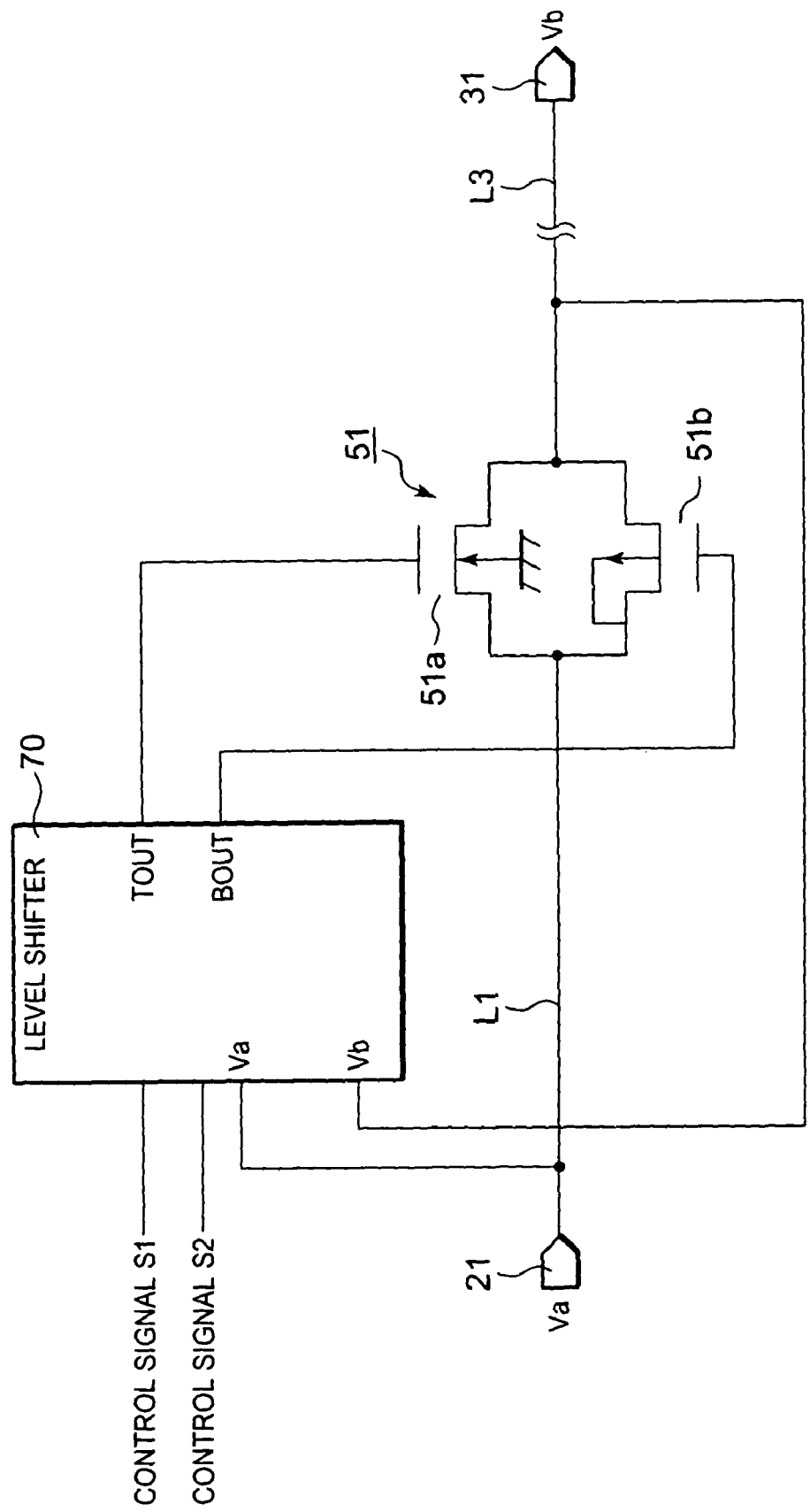
FIG. 2 is a block diagram of the transfer circuit and its vicinity in the first exemplary embodiment.

A more detailed circuit diagram for the first transfer circuit 51 is shown in FIG. 2. The first transfer circuit 51 of the first exemplary embodiment is formed on the first line L1 as already described. As shown in FIG. 2, this first transfer circuit 51 contains a NMOS transistor 51a and a PMOS transistor 51b. A level shifter 70 connected to this first transfer circuit 51 is installed in the vicinity of this first transfer circuit 51.

The internal circuit 4 supplies the control signals S1, S2 to the level shifter 70. The signal from the external connection terminal 21 is input to the Va terminal on the level shifter 70. The signal from the memory connection terminal 31 is in the same way input to the Vb terminal of the level shifter 70.

The control signal S1 that the internal circuit 4 inputs to the level shifter 70 has the function of controlling the transfer circuit ON and OFF states. The control signal S2 on the other hand has the function of controlling the signal transfer direction. More specifically, the control signal S2 selects whether to use either the external connection terminal 21 side or the memory connection terminal 31 side as the high level signal. A specific example is shown in Table 1.

TABLE 1

| Control Signal S1 | Control Signal S2 | TOUT | BOUT | First Transfer Circuit 51 |
|---|---|---|---|---|
| 0 | 0 | GND | Va | OFF |
| 0 | 1 | GND | Vb | OFF |
| 1 | 0 | Va | GND | ON |
| 1 | 1 | Vb | GND | ON |

As shown in Table 1, when the control signal S1 is 0, the first transfer circuit 51 is in the off state. When the control signal S1 is 1, the first transfer circuit 51 is in the on state. If the first transfer circuit 51 is in the off state, and the control signal 2 is 0, then the TOUT side reaches a voltage potential Va supplied via the external connection terminal 21, and the BOUT side reaches GND (ground) potential. Conversely, if the control signal S2 is 1, then the TOUT side reaches a voltage potential Vb supplied via the memory connection terminal 31, and the BOUT side reaches GND (ground) potential. Therefore, when the control signal S1 is 1, and also the control signal S2 has been set to 0, the signal is sent from the external connection terminal 21 towards the memory connection terminal 31. When the control signal S2 is set to a 1, a signal is sent from the memory connection terminal 31 towards the external connection terminal 21. The second transfer circuits 52 through eighth transfer circuits 58 of the first exemplary embodiment also possess the same structure as the first transfer circuit 51.

The first transfer circuits 51 through eighth transfer circuits 58 as structured above can also be independently controlled via the on and off signals, and utilized as a means for switching the signal transfer path. In the first exemplary embodiment, the example described using a transfer circuit as the switching means for switching the signal transfer path but this invention is not limited to that method and there are no particular restrictions as long as there is a switching function. A structure made up for example of a single transistor may be utilized.

The first input buffer IB11 formed inside the test circuit 6 has the task of sending the external signal input from external terminal 11, to the internal circuit 4 and the memory chip 2. This first input buffer IB11 can be turned on and off by an enable signal transferred from the test circuit control line of internal circuit 4. The output signal from the first input buffer IB11 is supplied via the line $L13_1$ to the internal circuit 4. The output signal from the first input buffer IB11 is also supplied to the first flip-flop F11. The output signal from the first input buffer IB11 is further supplied via the line $L13_2$ to the first (No. 1) input terminal of the first selector S11.

The signal sent from the first input buffer IB11 to the internal circuit 4 is supplied by way of the line $L13_3$ from the internal circuit 4, to the second (No. 2) input terminal of the first selector S11 within the test circuit 6. The signal that the first input buffer IB11 supplies to the first flip-flop F11 synchronizes with the clock signal and latches (the flip-flop), and is supplied to the latter stage second flip-flop F12. This second flip-flop F12 synchronizes with the clock signal and latches, and the signal is supplied to the third (No. 3) input terminal of the first selector S11 in the latter stage. The clock signal is supplied by way of the test circuit control line of internal circuit 4.

The first selector S11 decides which of the input signals among the above three input terminals to output, based on a select signal sent by way of the test circuit control line of internal circuit 4. The first selector S11 then supplies the selected signal to the first output buffer OB11. The output signal from the first output buffer OB11 is then supplied via the memory connection terminal 31 to the memory terminal 41.

The second input buffer IB12 installed within the test circuit 6 has the task of sending the signal output from the memory terminal 41 of memory chip 3, and input from the memory connection terminal 31, to the internal circuit 4 and the external terminal 11. This second input buffer IB12 can be turned on and off by an enable signal sent from the test circuit control line of internal circuit 4. An output signal from the second input buffer IB12 is supplied by way of line $L31_1$ to the internal circuit 4. The output signal from the second input buffer IB12 is also supplied to the fourth flip-flop F14. Moreover, the output signal from the second input buffer IB12 is supplied by way of the line $L31_2$ to the first (No. 1) input terminal of the second selector S12.

The second selector S12 decides which of the input signals among the above three input terminals to output, based on a select signal sent by way of the test circuit control line of internal circuit 4. The second selector S12 then supplies that selected signal to the second output buffer OB12. The output signal from the second output buffer OB12 is supplied by way of the external connection terminal 21 to the external terminal 11.

The first input buffer IB21, the second input buffer IB22, the first flip-flop F21—fourth flip-flop F24, the first selector S21, the second selector S22, the first output buffer OB21, and the second output buffer OB22 installed between the second transfer circuit 52 and the fourth transfer circuit 54 also possess the same structure.

The operation of the semiconductor integrated circuit device 101 of the first exemplary embodiment is described next while referring to the block diagrams in FIG. 3 through FIG. 6. There are four operating modes in the memory chip 3 contained in the semiconductor integrated circuit device 101 of the first exemplary embodiment. More specifically, there is a (1) actual operation mode, (2) memory chip function test mode, (3) analog test mode, and a (4) analog level test mode.

(1) Actual Operation Mode

Figure 3:
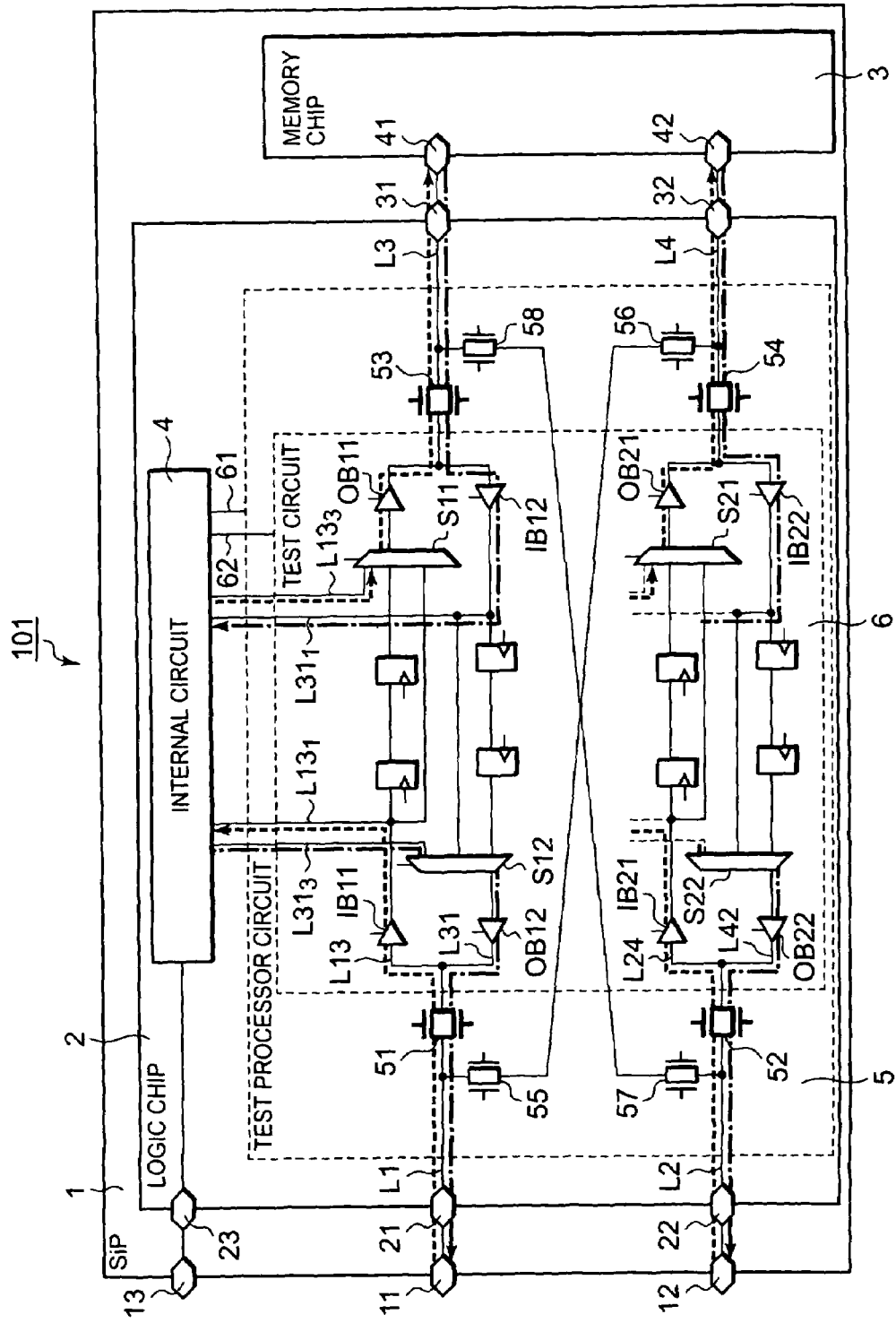
FIG. 3 is a block diagram for describing the signal transfer path of the actual operation mode for accessing the memory chip in the first exemplary embodiment.

During the actual operation mode, a memory access signal from the internal circuit 4 is supplied from the logic chip 2 to the memory chip 3 to access the memory chip 3 (See dotted line arrows in FIG. 3). Among the transfers during actual operation mode, the first transfer circuit 51—fourth transfer circuit 54 turn on, and the fifth transfer circuit 55—eighth transfer circuit 58 turn off. More specifically, a signal input supplied from the external terminals 11, 12 is supplied respectively to the external connection terminals 21, 22, and is further supplied to the test processor circuits 5, and the test circuit 6.

The signal input to the first input buffer IB11 of test circuit 6 is sent by way of the line $L13_1$ to the internal circuit 4. The specified operation is then executed inside the internal circuit 4 according to the input signal, and an output signal is then input by way of the line $L13_3$ to the first selector S11. During actual operation mode, the first input selector S11 supplies the input signal from this internal circuit 4 to the first output buffer OB11. The output signal from this first output buffer OB11 is sent from the memory connection terminal 31 to the memory terminal 41 inside the memory chip 2. The operation for accessing the memory chip 3 is implemented in this way.

On the other hand, when transferring data read-out commands from the logic chip 2, the data is read out in the memory chip 3 from the specified address, and the read out data then sent to the logic chip 2 (See dot-dash line arrows in FIG. 3). More specifically, the signal output from the memory terminal 41 is connected to the memory connection terminal 31, further input to the test processor circuit 5 and the test circuit 6, and then the output of the second input buffer OB12 is sent via the line L311 to the internal circuit 4. The specified operation is then performed in the internal circuit 4 according to the signal that was output, and the output signal is supplied by way of the line L13$_3$ to the second selector S12 within the test circuit 6. In the actual operation mode, the input signal from this internal circuit 4 is output from the second selector S12 and supplied to the second output buffer OB12. The output signal from the second output buffer OB12 is sent from the external connection terminal 21 to the external terminal 11. A similar signal path is used between the external connection terminal 22 and the memory connection terminal 32.

(2) Function Test Mode

Figure 4:
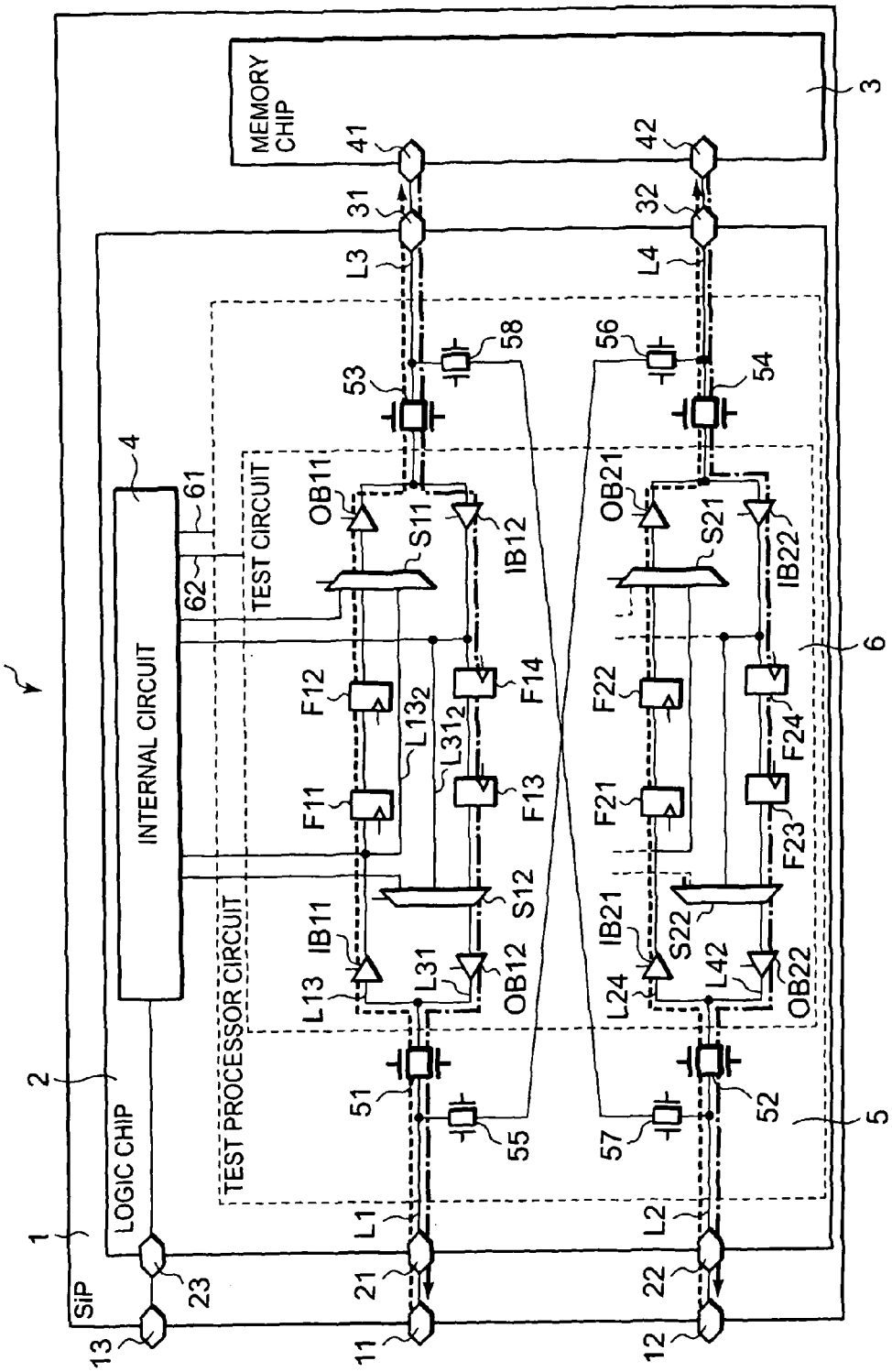
FIG. 4 is a block diagram for describing the signal transfer path of the memory chip function test mode of the first exemplary embodiment.

When making the memory chip function test in the semiconductor circuit device 100 of the first exemplary embodiment, a tester (not shown in drawing) serving as the external device, supplies a signal by way of the external terminals 11, 12 to the test circuit 6, and also accesses the memory chip 3 (See dotted line arrows in FIG. 4). During the function test mode, the first transfer circuit 51—fourth transfer circuit 54 turn on, and the fifth transfer circuit 55—eighth transfer circuit 58 turn off so that the signal from the external terminals 11, 12 for accessing the memory chip 3 attains a signal transfer path via the input/output buffers for changing the (signal) amplitude within the test circuit 6.

During the function test of the memory chip 2, the signal input from the tester (not shown in drawing) to the external terminal 11, is supplied to the external connection terminal 21, and further supplied into the test processor circuit 5 and the test circuit 6. The output from the first input buffer IB11 mounted within the test circuit 6 latches the first flip-flop F11, and that output latches the second flip-flop F12. The output signal from the second flip-flop F12 is then input to one terminal on the first selector S11. Also, the output from the first input buffer IB11 is input to another input terminal on the first selector S11.

During high speed mode as in patent document 1, the test circuit control signal connected to the first selector S11, selects a signal for the route through the flip-flop circuits and outputs the signal. In the low speed mode, however, the test circuit control signal connected to the first selector S11, selects a route for the signal that is not through the flip-flop circuits and outputs the signal. The first output buffer OB11 supplies a signal by way of the third transfer circuit 53, to the memory connection terminal 31, and the signal is further sent to the memory terminal 41 within the memory chip 3. The transmit path from the second external terminal 12 to the second memory terminal 42 is the same. Arranging the flip-flop circuit as shown in FIG. 1 allows suppressing variations in the delay time that are caused by fluctuations in device characteristics. The high speed signal can also propagate over long distances.

The output signal from the memory chip 3 connects from the memory terminals 41, 42 to the external terminals 11, 12 by way of the arrow line for the path shown by the dot-dash line in FIG. 4. This output signal is supplied from the memory terminal 41 to the memory connection terminal 31, and further supplied by way of the third transfer circuit 53 to the second input buffer B12. Then, in the case of high speed mode, the second selector S12 selects and outputs the signal latched in sequence by the fourth flip-flop F14 and the third flip-flop F13. In the case of low speed mode, however, a signal sent by way of the line L312 not passing through the flip-flops circuits is selected via the test circuit control signal connected to the second selector S12 and is output by the second selector S12. The output signal from the selector S12 is supplied to the second output buffer OB12, and the signal supplied by way of the first transfer circuit 51 to the external connection terminal 21, and sent to the external terminal 11. The transmit path from the second memory terminal 42 to the second external terminal 12 is the same.

Signals from the tester functioning as the external device utilize the above described signal transfer circuits to access the memory chip 3 by way of the logic chip 2 and make function tests on the memory chip 3.

(3) Analog Test Mode

Figure 5:
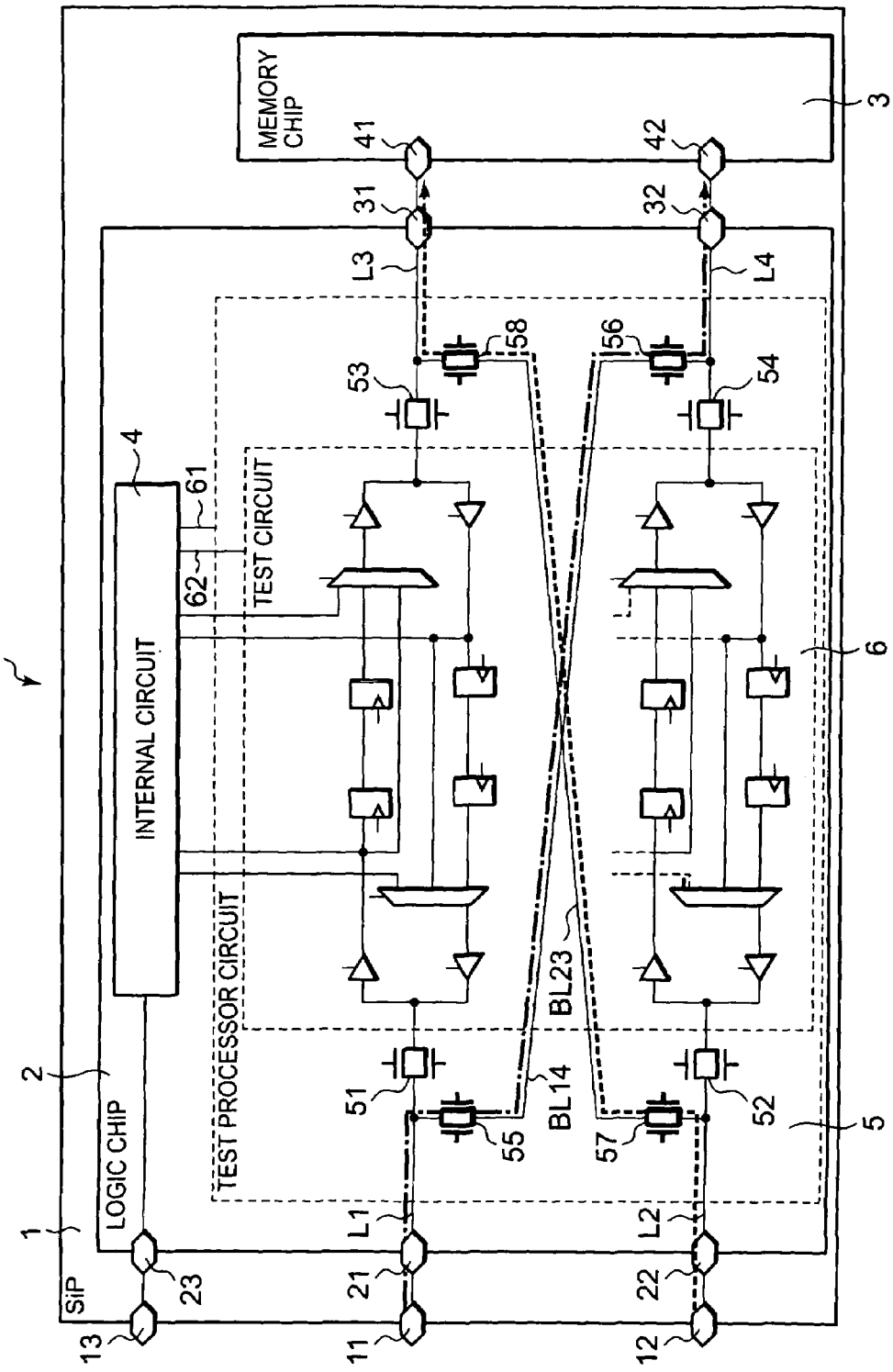
FIG. 5 is a block diagram for describing the signal transfer path for the memory chip analog test of the first exemplary embodiment.

Analog testing in the semiconductor integrated circuit device 100 of the first exemplary embodiment is executed by accessing the memory chip 3 from the external terminals 11, 12 by way of the bypass lines BL14, BL23 within the test processor circuit 5 (See dotted line and dot-dash line path arrows in FIG. 5). In analog test mode, the first transfer circuit 51—the fourth transfer circuit 54 turn off, and the fifth transfer circuit 55—eighth transfer circuit 58 turn on so that the signal for accessing the memory chip 3 from the external terminals 11, 12 transits a signal transfer path that bypasses the input/output buffers for changing the (signal) amplitude within the test circuit 6. By routing the signal transfer path via the bypass lines BL14, BL23, the memory terminals 41, 42 can be connected with the driver and comparator of the tester (not shown in drawing) without passing through circuits that change the (signal) amplitude; and analog tests can be executed on the memory terminals 41, 42.

The analog tests are performed for example by sensing the electrical current quantity that flows when a specified voltage is applied from the external terminal 11. A specified voltage applied to the external terminal 11 is supplied to the external connection terminal 21, and is further supplied to the test processor circuit 5. The voltage is also supplied to the fourth line L4 by way of the bypass line BL14 from the first line L1 within the test processor circuit 5. The fifth transfer circuit 55 and the sixth transfer circuit 56 are in the on state on the bypass line BL14 as already described. The specified voltage applied to the external terminal 11, is supplied to the memory connection terminal 32 of the logic chip 2, and is further supplied to the memory terminal 42 (See dot-dash line path arrows in FIG. 5). At this time, defective products can be detected by judging whether or not the electrical current quantity is within the specifications. The same test is also performed on the path from the external terminal 12 to the memory terminal 41 (See dotted line arrows in FIG. 5).

The analog test can also be implemented by detecting the waveform when the specified signal is sent from the external terminal 11. In this case, an external terminal for inputting a test signal, and an external terminal for detection are required. An example is described here using the external terminal 11 as the input side pin, and the external terminal 12 as the sensing (detection) side pin. The test signal applied to the external terminal 11 is supplied by way of the bypass line BL14 on the above route (See path shown by dotted line arrows in FIG. 5) to the memory terminal 42. The memory terminal 42 is connected to the memory terminal 41 by way of a line not shown in the drawing. The signal supplied to the memory terminal 41 is then detected on the external terminal 12 by way of the bypass line BL23. Defective products can be detected at this time by judging whether the waveform shape is within the specifications or not.

There are no test selection multiplexers (selectors) or logic input/output drivers (buffers) on the path from the tester (not shown in drawing) to the memory chip 3 taken along the signal transfer paths through the bypass lines BL14, BL23. Analog tests can therefore be made on the lines between the logic chip and the memory chip. Different types of analog tests including leak tests can therefore be made at the time of product shipment. A high reliability semiconductor integrated circuit device can therefore be provided by making memory chip function tests along with analog tests.

(4) Analog Level Test Mode

The analog level test of the semiconductor circuit device 100 of this exemplary embodiment is implemented by testing the performance of the input/output driver (buffer) relative to the memory chip 3. This so-called "analog level test" here refers to a test where H(High)/L(Low) logic (digital signals) are detected on the analog level. A zero (0) readout in the case of digital signal for example is here detected as an analog numerical value of 0.1 or 0.05, etc. Products judged as acceptable products in the case of digital signal are here detected as analog values, and judged by whether the analog value is within an acceptable range or not. Defective products can in this way be detected with high accuracy. Moreover, products that are acceptable in their early stage but that might deteriorate over time can be eliminated as products while in their early stage. Consequently, high quality semiconductor integrated circuit devices can be provided.

Figure 6:
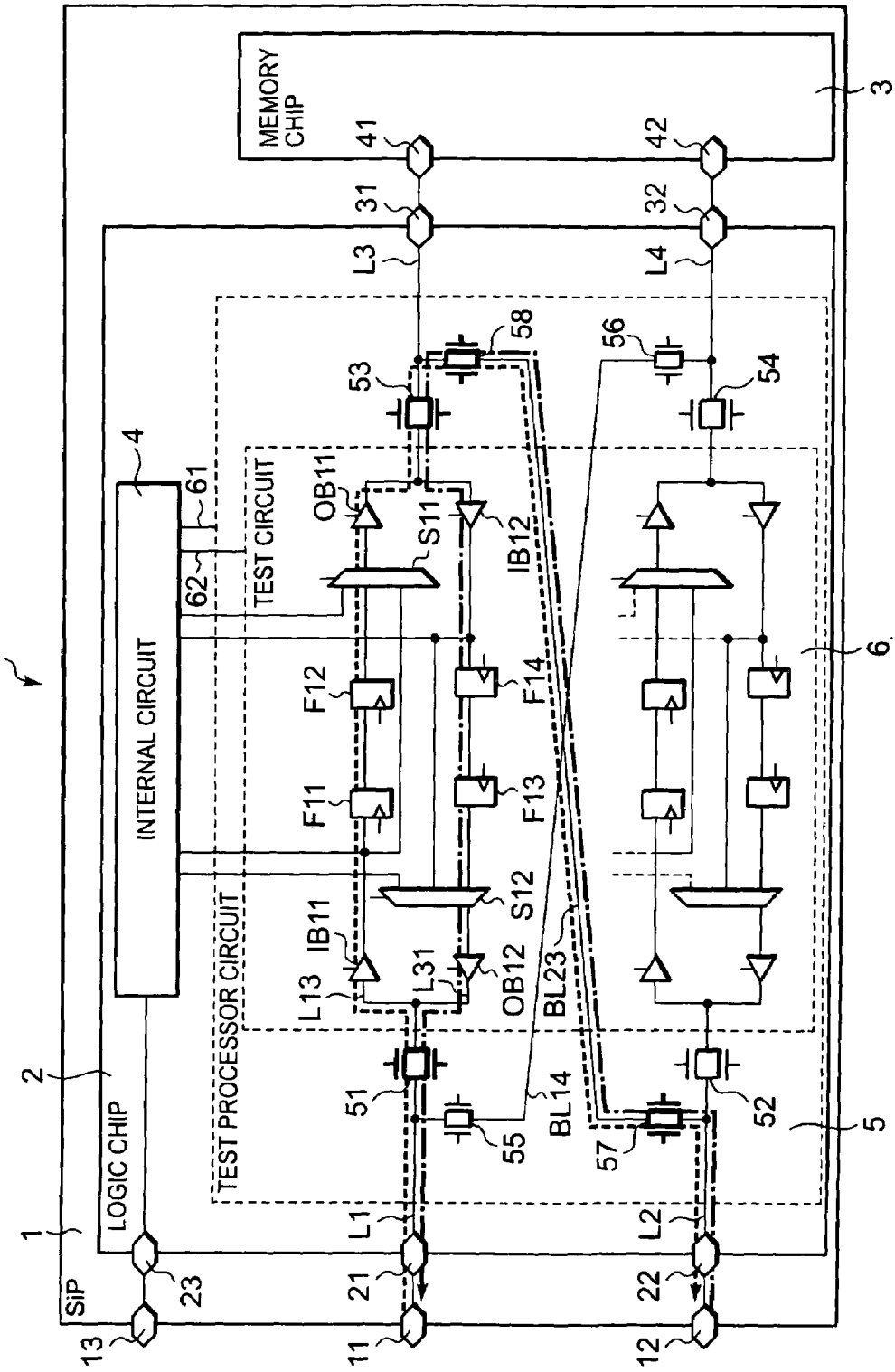
FIG. 6 is a block diagram for describing the signal transfer path when testing the analog levels of the output circuit characteristics on the memory chip of the first exemplary embodiment.

In the output driver (output circuit) of the first exemplary embodiment, the performance of the first output buffers OB11, OB22 formed inside the test circuit 6 are tested. The dotted line in FIG. 6 shows an example of the signal transfer circuit. In this example, the external terminal 11 functions as the pin for signal input, and the external terminal 12 functions as the sensing (detecting) pin. When executing the analog level test, the first transfer circuit 51, third transfer circuit 53, seventh transfer circuit 57 and eighth transfer circuit 58 are turned on, and the remaining four circuits: second transfer circuit 52, fourth transfer circuit 54—sixth transfer circuit 56 are turned off, so that the access signal from the external terminal 11 is detected by the external terminal 12 by way of the first output buffer OB11 within the test circuit 6.

More specifically, the signal input from the external terminal 11 is supplied to the external connection terminal 21, and is also supplied to the test processor circuit 5 and the test circuit 6. The first selector S11 selects high speed mode for the output signal from the first buffer IB11 formed inside the test circuit 6. In other words, the output from the first selector S11 is the output from the first buffer IB11 via the first flip-flop F11, and the second flip-flop F12. The output signal from the first selector S11 is then supplied to the first output buffer OB11. The signal is then supplied by way of the third transfer circuit 53, and the eighth transfer circuit 58 and the seventh transfer circuit 57 of the bypass line BL23 to the external connection terminal 22 and is detected at the external terminal 12.

The signal detected at the external terminal 12 passes through circuits that change the (signal) amplitude such as the selector circuit and the buffer circuit and therefore becomes a high or low digital signal. Here, however, the signal is detected at an analog level as described above and is not detected as a digital signal of 0 or 1. This analog value is then judged for whether the value falls within the specifications or not, and the performance of the first output buffer OB11 serving as the logic output driver then decided to be satisfactory or unacceptable.

The performance of the second input buffer IB12 serving as the logic input driver is judged as satisfactory or unacceptable by using the external terminal 12 to detect the signal input from the external terminal 11 via the path shown by the dot-dash line arrow in FIG. 6. In this case, the external terminal 12 is utilized as the input pin, and the external terminal 11 is utilized as the sensing (detecting) pin. More specifically, the signal input from the external terminal 12 is supplied to the external connection terminal 22 and then supplied by way of the seventh transfer circuit 57, eighth transfer circuit 58, and third transfer circuit 53 to the second buffer IB12 installed within the test circuit 6. Then, the output from the second buffer IB12 is in this example supplied by way of the fourth flip-flop F14 and the third flip-flop F13 as a signal selected and output by the second selector S12. The output signal from the second selector S12 is then supplied to the second input buffer IB12, and is also supplied by way of the first transfer circuit 51 to the external connection terminal 21, and detected as a signal from the external terminal 11. The performance of the second input buffer IB12 can then be tested by judging whether this analog value falls within the specifications.

The bypass line BL14 connects to the memory connection terminal 32 and the external connection terminal 21 within the logic chip 2 as already described. Signals can in this way be conveyed between terminals different from the memory connection terminal 31 that receives signals from the external connection terminal 21 during the memory chip function test. The bypass line BL23 connects in the same way. The analog level test as configured above can in this way be implemented.

The first exemplary embodiment provides a highly reliable semiconductor integrated circuit device because analog tests and analog level test as well as memory chip 3 function tests can be performed on the semiconductor integrated circuit device with SiP structure of the first exemplary embodiment where the logic chip 2 and the memory chip 3 are mounted in the same package.

The example of the first exemplary embodiment described using a semiconductor integrated circuit device with SiP structure where the memory chip 3 and logic chip 2 were mounted in the same package. However, multiple chips may be mounted in the same package, and this invention is also applicable to most semiconductor integrated circuits for making operation tests on a second chip by way of a first chip.

Second Exemplary Embodiment

An example of a semiconductor integrated circuit device different from the first exemplary embodiment is described next. In the following drawings, structural members identical to the first exemplary embodiment are assigned the same reference numerals and a description omitted for purposes of convenience.

Except for the following points, the semiconductor integrated circuit device of the second exemplary embodiment is identical to the basic structure of the semiconductor integrated circuit device of the first exemplary embodiment. Namely, in contrast to the first exemplary embodiment where the memory connection terminals 31, 32 and the external connection terminals 21, 22 of the logic chip 2 are function test and the analog test, the second exemplary embodiment differs in the point that these components are installed so as to transfer signals between the same terminals in the function test and the analog test. Moreover, the types of signals supplied to the level shifter are different from the first exemplary embodiment.

Figure 7:
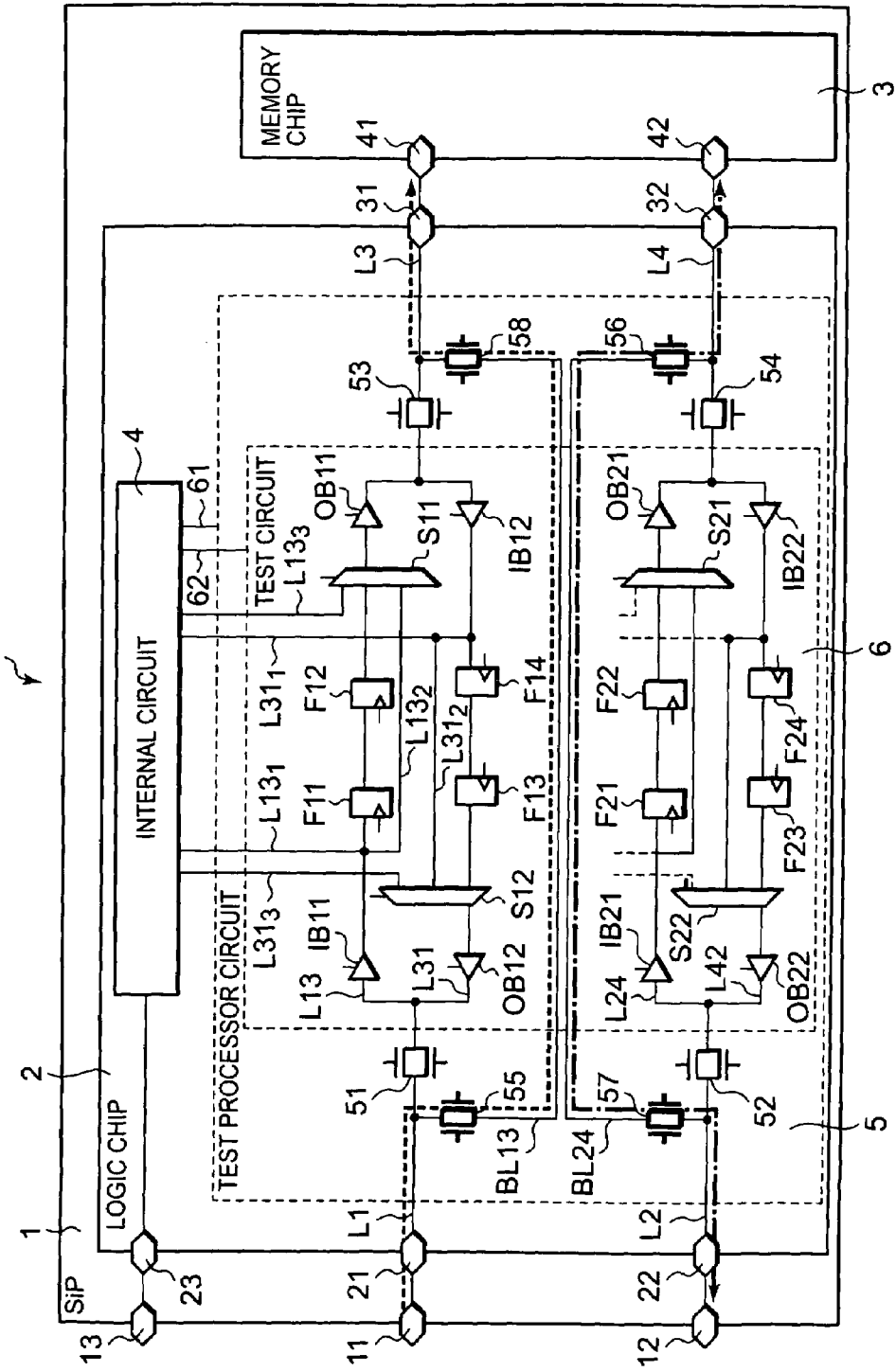
FIG. 7 is a structural block diagram of the semiconductor integrated circuit device of a second exemplary embodiment.

The semiconductor integrated circuit device 102 of the second exemplary embodiment is shown in the block diagram of FIG. 7. There are two bypass lines in the second exemplary embodiment. More specifically, these lines are the bypass line BL13 and BL24. The bypass line BL13 within the test processor circuit 5 is structured to bypass the input/output buffers installed in the test circuit 6 for changing the (signal) amplitude and also connects at the ends to the first line L1 and the third line L3. The bypass line BL24 within the test processor circuit 5 in the same way is formed so as to bypass the input/output buffers installed in the test circuit 6 for changing the amplitude and moreover to connect at the ends to the second line L2 and the fourth line L4. The fifth transfer circuit 55 and the eighth transfer circuit 58 are formed in the bypass line BL13. The sixth transfer circuit 56 and the seventh transfer circuit 57 are formed in the same way on the bypass line BL24.

Figure 8:
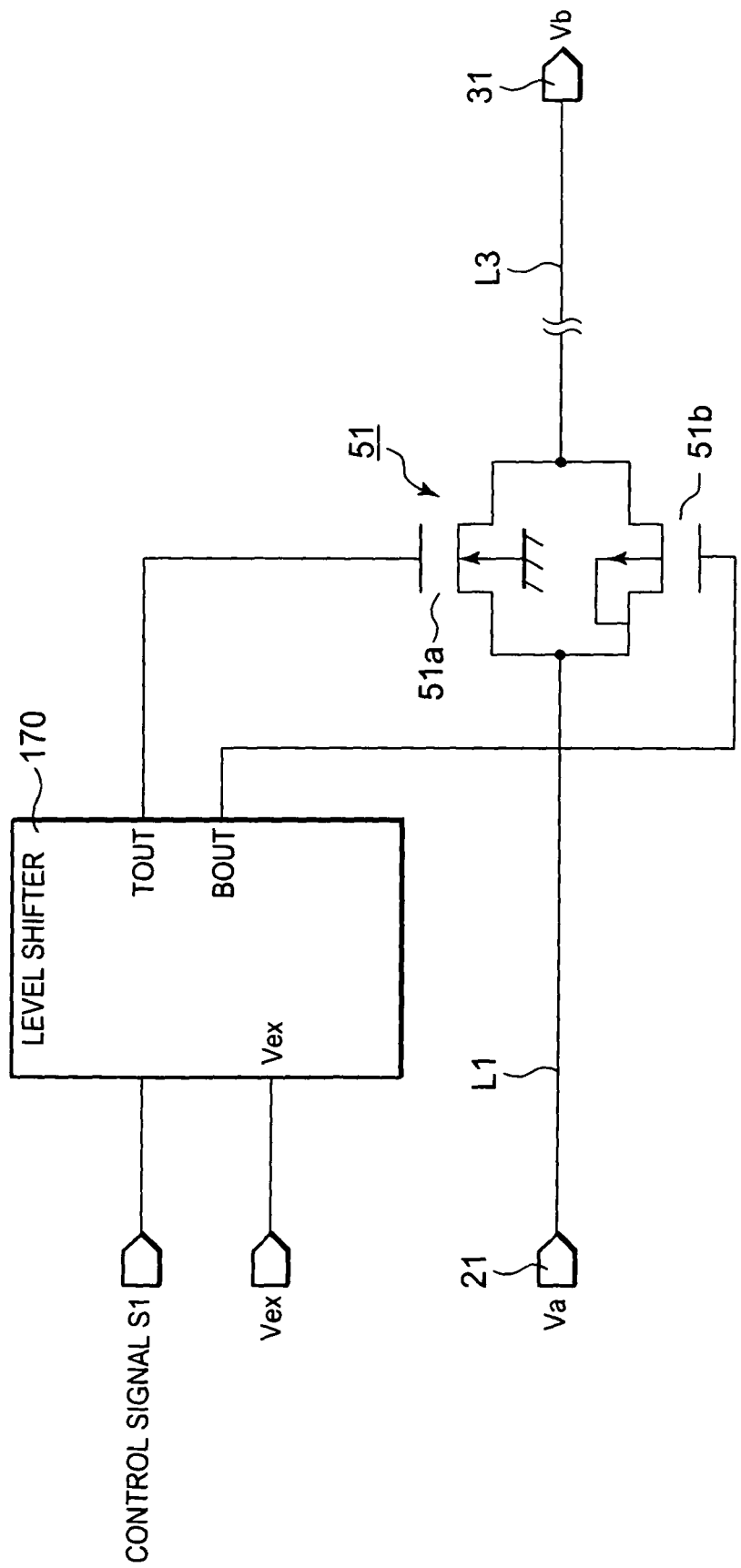
FIG. 8 is a block diagram of the transfer circuit and its vicinity in the second exemplary embodiment.

FIG. 8 is a detailed circuit diagram of the first transfer circuit 51 of the second exemplary embodiment. The first transfer circuit 51 of the second exemplary embodiment is installed on the first line L1 the same as in the first exemplary embodiment. The structure of the first transfer circuit 51 is also the same as the first exemplary embodiment. However, the types of signals lines for supplying signals to the level shifter 170 connected to the first transfer circuit 51 are different.

The internal circuit 4 supplies the control signal S1 to the level shifter 170. Moreover, instead of supplying the control signal S2 from the internal structure 4; a voltage potential Vex is supplied according to the particular mode, from the external terminal 114 (See FIG. 7.) mounted on the package 1. The structure for inputting a signal from the external connection terminal 21 to the Va terminal of the level shifter 170, as well as the structure for inputting a signal from the memory connection terminal 31 to the Vb terminal of the level shifter 170 are the same as in the first exemplary embodiment.

The control signal S1 input from the internal circuit 4 to the level shifter 170 fulfills the task of controlling the on and off operation of the transfer circuit the same as in the first exemplary embodiment. The Vex voltage potential supplied from external terminal 114 on the other hand supplies a fixed voltage potential according to the particular operation mode. Table 2 shows a specific example.

TABLE 2

| Control signal S1 | TOUT | BOUT | First transfer circuit 51 |
|---|---|---|---|
| 0 | GND | Vex | OFF |
| 1 | Vex | GND | ON |

As shown in Table 2, the first transfer circuit 51 is off when the control signal S1 is 0; and the first transfer circuit 51 is on when the control signal S1 is 1. In the case where the first transfer circuit 51 is in the on state, the external terminal 114 supplies a voltage potential Vex to the TOUT side; and the BOUT side reaches GND (ground) potential. The signal transfer direction can be varied by changing the value of voltage potential Vex according to the particular operation mode.

In the second exemplary embodiment, in the structure shown in FIG. 8, a level shifter 170 is connected to the second transfer circuit 52—eighth transfer circuit 58. Utilizing this structure allows individually controlling the on/off signals in the first transfer circuit 51—eighth transfer circuit 58, and so is utilized as a means for switching the signal transfer paths.

The actual operation mode and the memory chip function test mode in the semiconductor integrated circuit device 102 of the second exemplary embodiment are implemented along the same paths as in the first exemplary embodiment. The analog test mode however is implemented by utilizing the bypass lines BL13, BL24 (See the dotted line paths in FIG. 7.). In the analog test mode, the first transfer circuit 51—fourth transfer circuit 54 are turned off, and the fifth transfer circuit 55—eighth transfer circuit 58 are turned on so as to form a signal transfer path where the signal for accessing the memory chip 3 from the external terminals 11, 12, bypasses the input/output buffer that changes the amplitude within the test circuit 6.

The analog test is performed for example by detecting the current flow quantity when a specified voltage is applied from the external terminal 11 as shown by the dotted line in FIG. 7. The specified voltage applied to the external terminal 11, is supplied to the external connection terminal 21, and further supplied to the test processor circuit 5. The voltage is then supplied from the first line L1 within the test processor circuit 5 by way of the bypass line BL13 to the second line L2. The fifth transfer circuit 55 and the eighth transfer circuit 58 are in the on state on the bypass line BL13 as already described. Voltage is then supplied to the memory connection terminal 31 of logic chip 2, and voltage is further supplied to the memory terminal 41. Defective products can then be found by deciding whether the electrical current quantity flowing at this time is within the specifications or not. The analog test can be performed in the same way on the memory terminal 42 path from the external terminal 12 (See the dot-dash line path arrows in FIG. 7.).

The analog test is made by detecting the waveform when the specified signal was sent from the external terminal 11. In this case, making this test requires an external terminal to input the test signal, and an external terminal for detection. One example describes the case of using the external terminal 11 as the input side pin, and using the external terminal 12 as the pin on the detecting side. The test signal applied to the external terminal 11 passes along a route (dotted line shown in FIG. 7) by way of the bypass line BL13 and is supplied to the memory terminal 41. The memory terminal 41 is connected to the memory terminal 42 by a line not shown in the drawing. The external terminal 12 then detects the signal supplied to the memory terminal 12, by way of the bypass line BL24. A defective product can be detected by deciding whether or not the waveform is within the specifications at this time.

There are no test select multiplexers (selectors) or logic input/output drivers (buffers) installed on the path from the tester (not shown in drawing) to the memory chip 3 which serves as the signal transfer path taken by the bypass line. The analog test can therefore be implemented on the line between the logic chip and the memory chip. Analog tests such as leak tests can in this way be performed prior to product shipment.

A memory chip analog test can be performed on the semiconductor integrated circuit device 102 of the second exemplary embodiment in addition to the memory chip function test so defective products can be detected with high accuracy. A high reliability semiconductor integrated circuit device can therefore be provided.

Third Exemplary Embodiment

Except for the following points, the semiconductor integrated circuit device of the third exemplary embodiment is identical to the basic structure of the semiconductor integrated circuit device of the first exemplary embodiment. Namely, in contrast to the first exemplary embodiment where bypass lines are formed so as to cross between two pairs of terminals joining the memory chip 3 and the logic chip 2; the third exemplary embodiment differs in the point that the bypass lines are formed between three pairs of terminals joining the memory chip 3 and the logic chip 2.

Figure 9:
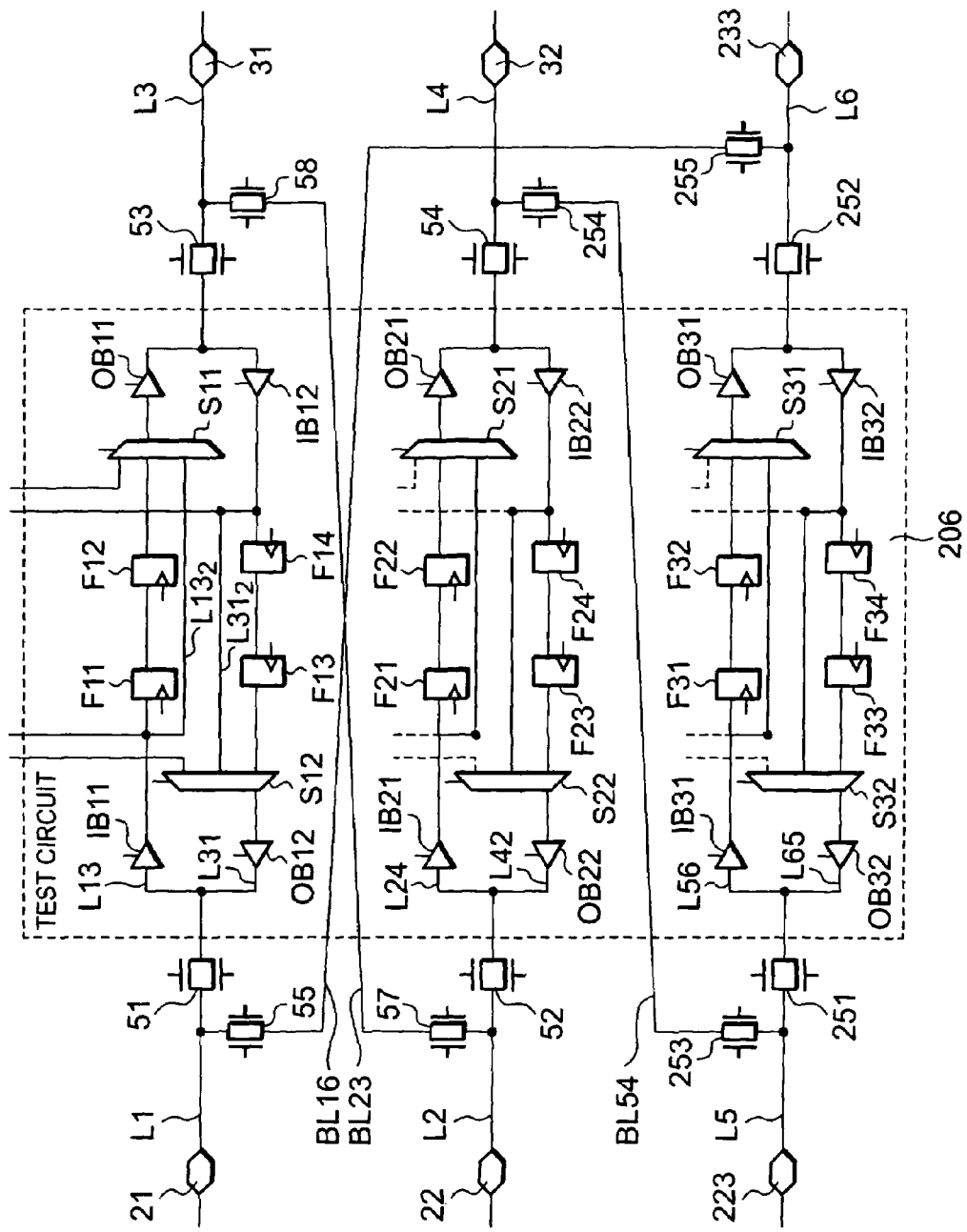
FIG. 9 is a structural block diagram of the semiconductor integrated circuit device of a third exemplary embodiment.
Figure 10:
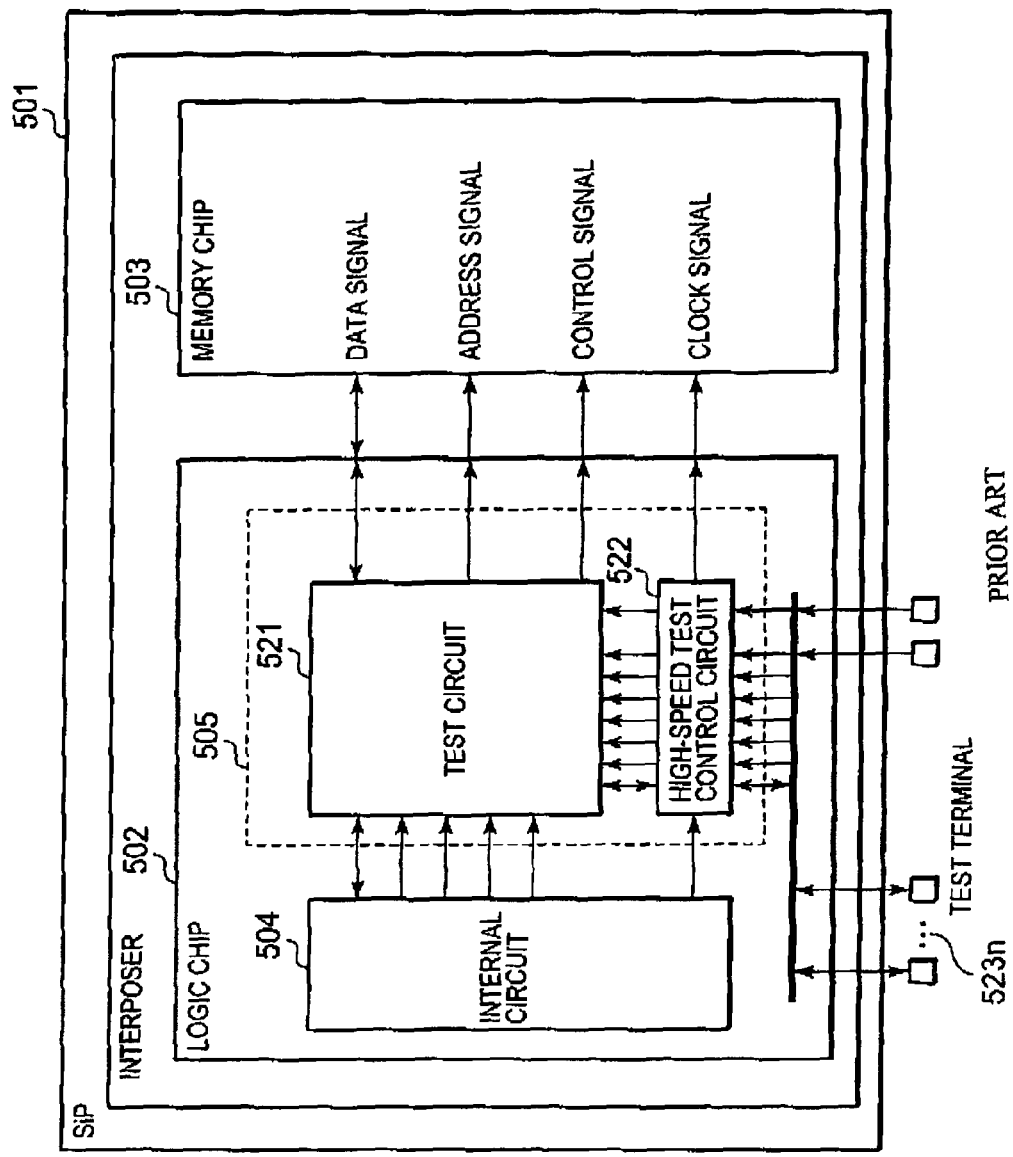
FIG. 10 is a structural block diagram of the semiconductor integrated circuit device of a related art.
Figure 11:
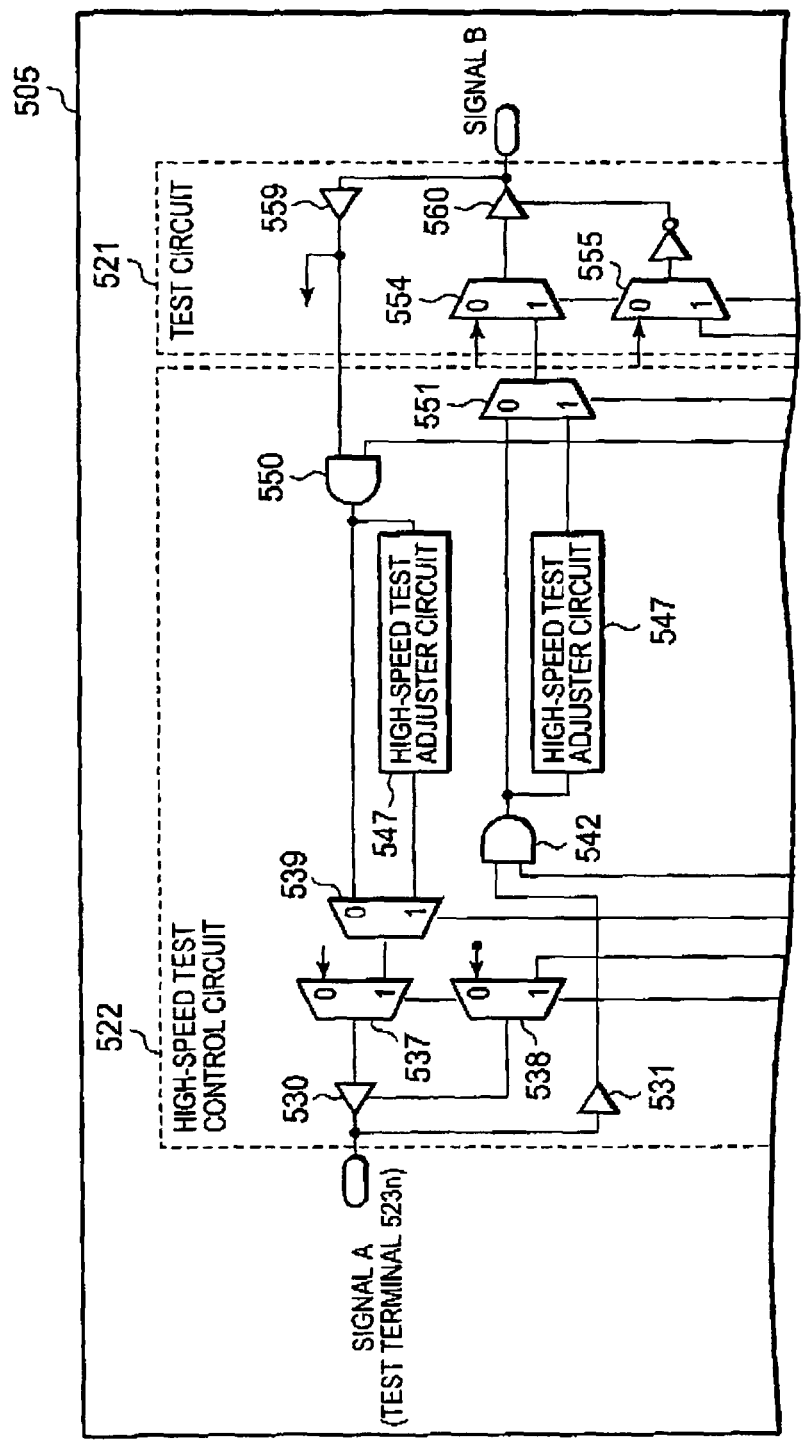
FIG. 11 is a structural block diagram of the test processor circuit of a related art.

FIG. 9 is a block diagram showing the test circuit 206 in the semiconductor integrated circuit device of the third exemplary embodiment. Three bypass lines are formed in the third exemplary embodiment. More specifically, these bypass lines are BL16, BL23, and BL54. The bypass line BL16 within the test processor circuit 5 is structured to bypass the input/output buffers within the test circuit 6 that change the (signal) amplitude and further to connect the first line L1 and the sixth line L6 at the ends of the test circuit. The bypass line BL23 within the test processor circuit 5 is structured in the same way, to bypass the input/output buffers within the test circuit 6 that change the (signal) amplitude, and further is structured to connect the second line L2 and the third line L3 at the ends of the test circuit. Also, the bypass line BL54 within the test processor circuit 5 is structured so as to bypass the input/output buffers within the test circuit 6 that change the (signal) amplitude, and moreover to connect the fifth bypass line L5 and the fourth bypass line L4 at the ends of the test circuit.

The fifth transfer circuit 55 and the thirteenth transfer circuit 255 are formed on the bypass line BL16. The sixth transfer circuit 56 and the seventh transfer circuit 57 are in the same way formed on the bypass line BL23. Moreover, an eleventh transfer circuit 253 and a twelfth transfer circuit 254 are formed on the bypass line BL54. A ninth transfer circuit 251 is formed between a point subsequent from the fifth line L5 branching from the bypass line BL54, and just before the test circuit 206. A tenth transfer circuit 252 is in the same way formed between a point subsequent from the sixth line L6 branching from the bypass line BL16, and just before the test circuit 206.

The actual operation mode, the memory chip function test mode, the memory chip analog test mode, and the analog level test mode for evaluating characteristics for accessing the memory chip for the semiconductor integrated circuit device of the third exemplary embodiment can be implemented by the same method as in the first exemplary embodiment. In the semiconductor integrated circuit device of the third exemplary embodiment a bypass line can be formed between terminals on a signal transfer path different from the (path for the) memory chip function test even if there is an odd number of terminal pairs joining the logic chip and memory chip, so the same tests as the first exemplary embodiment can be performed, and the same effects achieved.

Further, it is noted that Applicant's intent is to encompass equivalents of all claim elements, even if amended later during prosecution.

What is claimed is:

1. A semiconductor integrated circuit device, comprising:
a first chip including an internal circuit;
a second chip capable of being accessed only via the first chip;
a test processor circuit which accesses the second chip from an external terminal and tests the second chip, the test processor circuit being electrically connected to the internal circuit within the first chip;
a test circuit formed inside the test processor circuit, including an input/output buffer for signals for accessing the second chip;
a bypass line formed within the test processor circuit for transferring signals from the first chip to the second chip while bypassing the input/output buffer; and
a switch which switches between a signal transfer path via the input/output buffer, and a signal transfer path via the bypass line,
wherein the bypass line is formed so the different terminals on the first chip are used for accessing the second chip, by way of a signal transfer path via the bypass line and by way of the signal transfer path via the input/output buffer.

2. A semiconductor integrated circuit device according to claim 1, wherein the switch comprises a transfer circuit, and wherein the transfer circuit is formed, within the test processor circuit, at a pre-stage and a post-stage of the test circuit, and for the bypass line.

3. A semiconductor integrated circuit device according to claim 1, wherein the first chip comprises a logic chip, and the second chip comprises a memory chip.

4. The semiconductor integrated circuit device according to claim 1, wherein the second chip is accessed only via the first chip.

5. A test method comprising:
providing a semiconductor integrated circuit device which includes:
a first chip including an internal circuit;
a second chip capable of being accessed via the first chip;
a test processor circuit electrically connected to the internal circuit within the first chip, for accessing the second chip from an external terminal and testing the second chip;
a test circuit formed inside the test processor circuit, including an input/output buffer for signals for accessing the second chip;
a bypass line formed within the test processor circuit for transferring signals from the first chip to the second chip while bypassing the input/output buffer; and
a switch which switches between a signal transfer path via the input/output buffer and a signal transfer path via the bypass line;
making an analog test of an input/output terminal on the second chip by way of bypass lines from the external terminal;
inputting a signal from the external terminal;
passing the signal through the signal transfer path by way of the input/output buffer, and the signal transfer path by way of the bypass line; and
detecting an output signal at an analog level from an external terminal different from the external terminal that input the signal.

6. The test method according to claim 5, wherein the second chip is accessed only via the first chip.

7. A system in package (SIP), comprising:
a first external terminal;
a memory chip; and
a logic chip coupled between the first external terminal and the memory chip, the logic chip including:
a first terminal coupled to the first external terminal;
a second terminal coupled to the memory chip;
a test circuit including a logical path;
a bypass path without an intervention of the logical path;
a first switching element coupled between the first terminal and the test circuit;
a second switching element coupled between the second terminal and the test circuit;
a third switching element coupled between the first terminal and the bypass path; and
a fourth switching element coupled between the second terminal and the bypass path.

8. The system in package according to claim 7, further comprising:
a second external terminal,
wherein the logic chip further comprises:
a third terminal coupled to the second external terminal; and
a fifth switching element coupled between the third terminal and the test circuit, and wherein the logic path of the test circuit is coupled between the second switching circuit and the fifth switching circuit.

9. The system in package according to claim 8, wherein the memory is tested for an analog function through the first external terminal and a logical function through the second external terminal.

10. The system in package according to claim 8, wherein each of the first, the second, the third, the fourth, and the fifth switching elements comprise a transfer gate.

11. The system in package according to claim 8, wherein the logic chip further comprises:
   a sixth switching element coupled to the second terminal; and
   a seventh switching element coupled between the third terminal and the seventh switching element.

12. The system in package according to claim 7, wherein the logic chip further comprises:
   a fourth terminal coupled to the memory chip; and
   a sixth switching element coupled between the fourth terminal and the test circuit.

13. The system in package according to claim 7, further comprising a third external terminal,
   wherein the logic chip further comprises:
      a fifth terminal coupled to the third external terminal; and
      an internal circuit for implementing functions of the logic chip,
   wherein the internal circuit is coupled to the fifth terminal.

* * * * *